United States Patent [19]

Bernardo

[11] Patent Number: 5,721,784
[45] Date of Patent: Feb. 24, 1998

[54] ASYMMETRICAL DRIVER FOR ASYMMETRICAL LOUDSPEAKERS

[76] Inventor: Carmelo F. Bernardo, 12 Street, Lakandula, Angeles City, Philippines

[21] Appl. No.: 593,884

[22] Filed: Jan. 30, 1996

[51] Int. Cl.$^6$ .................................................. H04R 1/02
[52] U.S. Cl. ................................................. 381/89; 381/59
[58] Field of Search ........................... 381/96, 89, 59, 381/61

[56] References Cited

U.S. PATENT DOCUMENTS

| | | |
|---|---|---|
| 2,313,098 | 3/1943 | Shepard, Jr. . |
| 3,047,661 | 7/1962 | Winker . |
| 4,207,430 | 6/1980 | Harada et al. . |
| 4,260,954 | 4/1981 | Crooks . |
| 4,276,443 | 6/1981 | Meyers . |
| 4,340,778 | 7/1982 | Cowans et al. . |
| 4,809,336 | 2/1989 | Pritchard ............................... 381/61 |
| 4,821,328 | 4/1989 | Drozdowski . |
| 4,908,870 | 3/1990 | Nagi ..................................... 381/59 |
| 4,995,084 | 2/1991 | Pritchard ............................... 381/61 |
| 5,430,802 | 7/1995 | Page . |
| 5,542,001 | 7/1996 | Reiffin ................................... 381/96 |

Primary Examiner—Curtis Kuntz
Assistant Examiner—Vivian Chang
Attorney, Agent, or Firm—Schweitzer Cornman Gross & Bondell LLP

[57] ABSTRACT

An audio output system, having loudspeakers with an asymmetrical output in response to symmetrical modulated input signals, is provided with a unidirectional limiting circuit for proportionally reducing input signals of a polarity to drive the loudspeaker in the direction of its greatest response. In its basic form, the limiting circuit is a voltage limiting circuit, preferably a voltage divider, which includes a rectifier device. When the driving signal is of a polarity to produce a greater response from the loudspeaker, the rectifier device conducts and the magnitude of the signal voltage is reduced, resulting in substantially greater uniformity of output response of the loudspeaker in both directions. When the limiting circuit is placed on the input side of the power amplifier, the rectifier device advantageously is a vacuum tube connected as a diode. When located in the output stages of the power amplifier, where higher signal voltages are available, solid state rectifier devices may be employed. Multiple asymmetrical loudspeakers may be controlled using a single limiting circuit, provided all such loudspeakers are connected so that their greater response results when the signal thereto is of the same polarity.

9 Claims, 5 Drawing Sheets

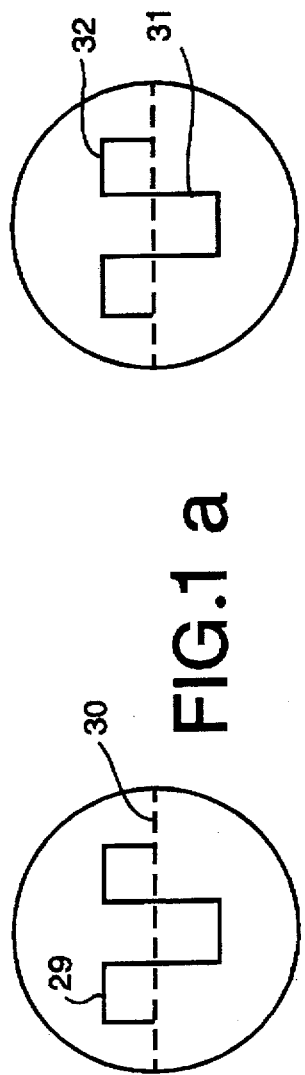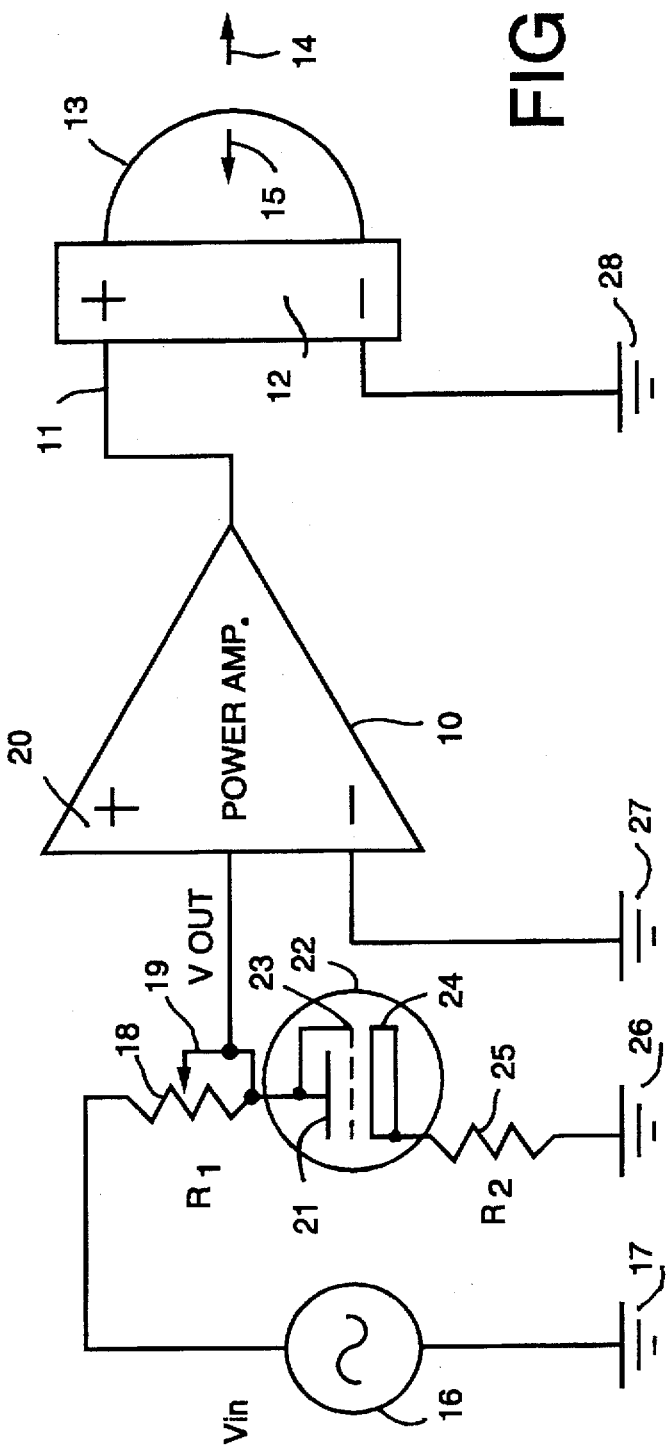

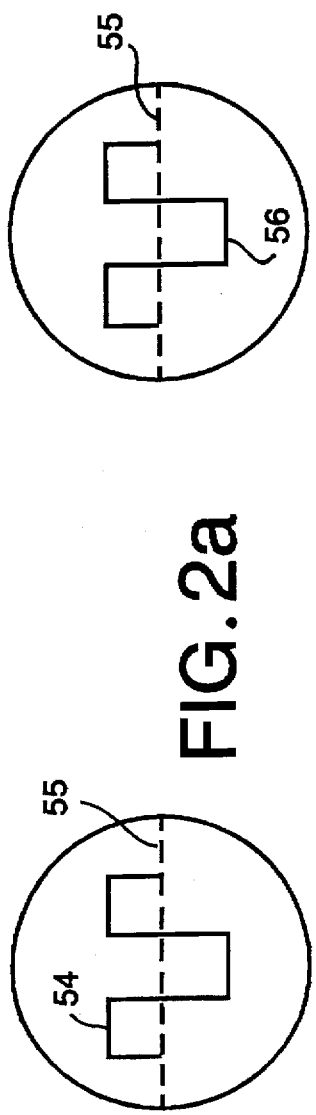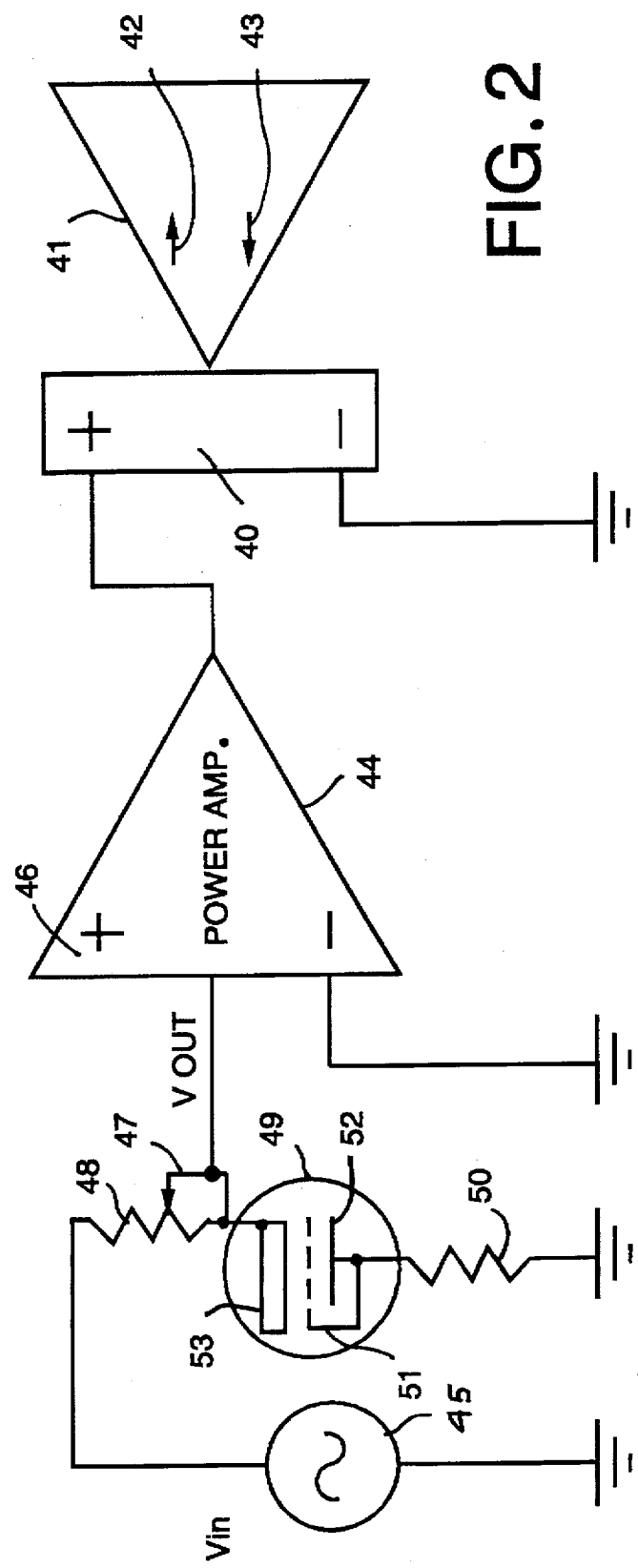

ASYMMETRICAL DRIVER FOR ASYMMETRICAL LOUDSPEAKERS

BACKGROUND AND SUMMARY OF THE INVENTION

Loudspeakers employed in many sound systems have inherent asymmetrical characteristics in that the driven diaphragm of the loudspeaker is more easily moved in one direction than the other. This is true of conical loudspeaker diaphragms, for example, as well as domes, elliptical and other shapes, where radiation resistance is unequal in the two directions in which the loudspeaker diaphragms are actuated to move. Some types of loudspeakers, such as planar and ribbon speakers are inherently symmetrical in their resistance to movement, but have other disadvantages that make them less desirable for widespread use.

Electromagnetically driven loudspeakers are actuated by a modulated signal voltage which alternates as a function of frequency and amplitude of the audible sound to be reproduced. In general, for a given level and frequency of a sound, the driving signal supplied to the electromagnetic loudspeaker is symmetrical in nature. Accordingly, if the loudspeaker itself has asymmetrical driving characteristics, the sound output from that loudspeaker will reflect in some measure those asymmetrical characteristics. By way of example, a typical conical loudspeaker will have greater resistance to motion in the forward direction than in the rearward direction, such that a symmetrical signal supplied for actuating the loudspeaker will produce a different result in the forward direction than in the rearward direction of diaphragm movement.

Electromagnetic loudspeakers are generally composed of a diaphragm and a suspension by which it can move freely from a center position. The mass of the diaphragm is subject to inertia which inhibits it from accurately reproducing the audio signals from a driving amplifier. Such characteristic of loudspeakers is generally known. It has been proposed to utilize special circuitry, employing feedback signals derived from the loading or positioning of the loudspeaker diaphragm, allowing the driving signal to be modified as necessary by comparing the character of the signal supplied with the instantaneous position of the loudspeaker diaphragm or the instantaneous loading thereon. Theoretically, such circuitry should be able to reduce the distortion of the output of the loudspeaker, but the circuit is relatively complex and costly, and not always fully effective.

It is an objective of the present invention to provide a driving circuit for an asymmetrical loudspeaker which is tuned in the first instance to the pre-ascertained asymmetrical characteristics of the loudspeaker and automatically modifies the driving signal, so that a relatively greater signal is supplied in the direction of the greatest resistance to movement, and a correspondingly lower signal is provided to drive the loudspeaker in the direction of lesser resistance. Pursuant to the invention, the asymmetrical characteristics of the loudspeaker to be utilized in a given system can be determined in advance by measurement, and the driving circuitry can then modified be to impart a directional bias to the driving signal, such that the resulting audio output from the otherwise asymmetric loudspeaker is substantially symmetrical. The system of the invention does not rely upon feedback. Instead, simple and economical circuity modifications are provided, which serve to constantly adjust the driving signal in direct proportion to the known asymmetrical characteristics of the loudspeakers.

The basic principles of the invention may be realized with a wide variety of specific circuit arrangements, with the objective at all times being to impose a predetermined bias on the driving signal to compensate for the known asymmetry of the loudspeaker to be driven. The signal modification may be executed at any point in advance of the loudspeaker, for example either at the input or output sides of the power amplifier.

For a more complete understanding of the above and other features and advantages of the invention, reference should be made to the following detailed description of preferred embodiments of the invention and to the accompanying drawings.

DESCRIPTION OF THE DRAWINGS

FIG. 1 is a simplified schematic representation of an example circuit arrangement according to the invention for modifying the input signal to a power amplifier driving a domed loudspeaker.

FIGS. 1a and 1b are illustrative representations of signal forms as received and after modification according to the invention.

FIG. 2 is a modified form of circuit for carrying out the principles of the invention, for modifying the input signal to a power amplifier driving a conical loudspeaker.

FIGS. 2a and 2b are illustrative representations of signal forms as received and after modification according to the invention.

DESCRIPTION OF PREFERRED EMBODIMENTS OF THE INVENTION

Figure 3:
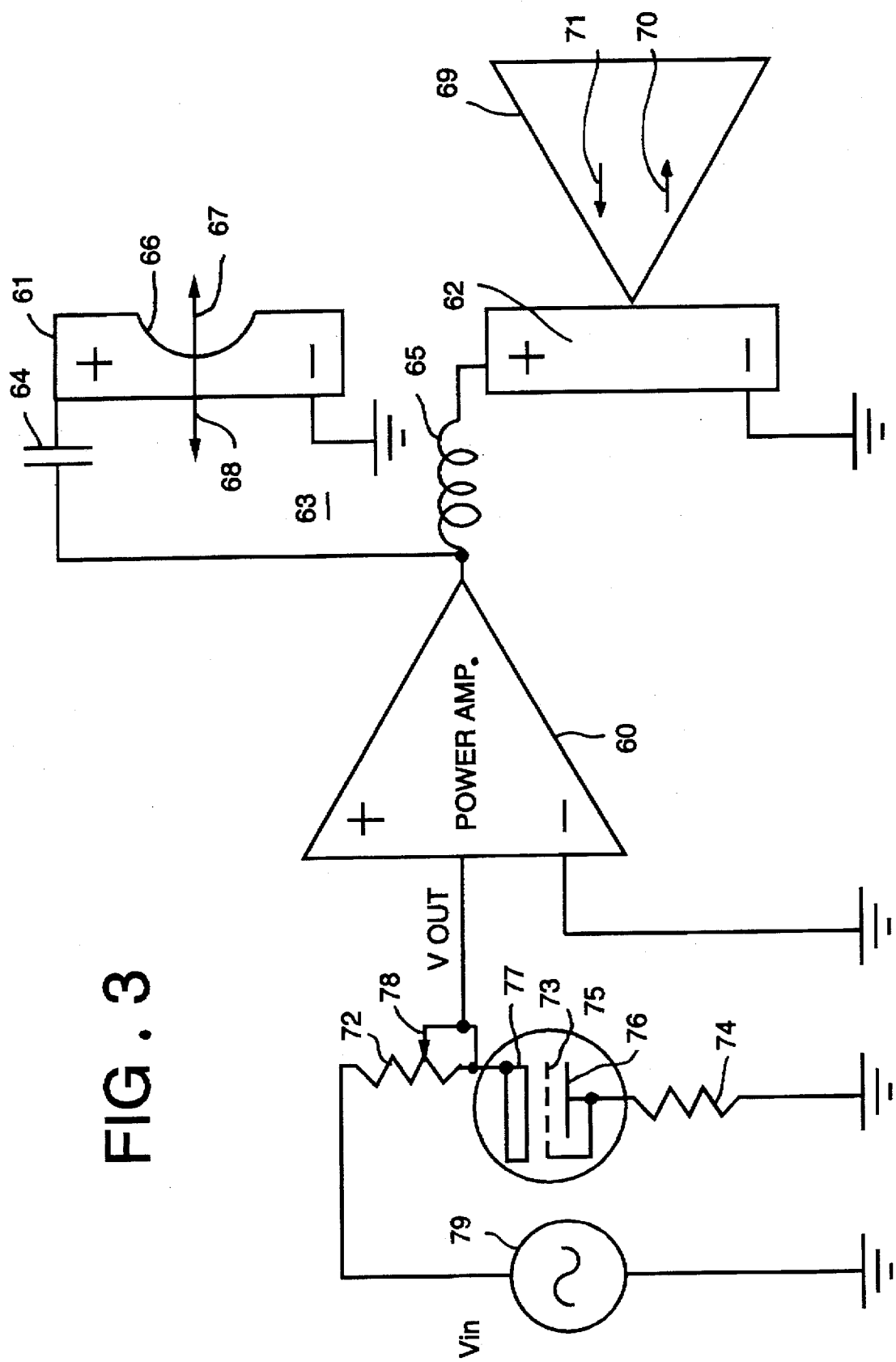
FIG. 3 is yet another example circuit, in which the input to a power amplifier is modified in accordance with the principles of the invention, and multiple loudspeakers of different types are driven by the output of the power amplifier.

Referring now to the drawing, and initially to FIG. 1, the reference numeral 10 designates generally a power amplifier device of a conventional type. The output 11 of the power amplifier is connected to one side of an electromagnetic loudspeaker 12. In the illustration of FIG. 1, the loudspeaker 12 has a domed diaphragm 13 with inherent asymmetrical characteristics which enable it to be driven more easily in the forward direction (arrow 14) than in the rearward direction (arrow 15).

Pursuant to the invention, the asymmetrical output characteristics of the loudspeaker 12, previously known or ascertained, are compensated for by appropriately modifying the signal which is input to the power amplifier 10. In this respect, the reference numeral 16 represents a source of modulated input voltage. The voltage source 16 is connected at one side 17 to ground and at its positive side to a variable resistor 18. The adjustable tap 19 of the variable resistor is connected both to the positive side 20 of the power amplifier 10 and to the anode 21 of a three element vacuum tube 22. The grid 23 of the tube is tied directly to the anode 21, and the cathode 24 is connected through a resistor 25 to ground at 26. One side of the power amplifier 10 and one side of the loudspeaker 12 are also connected to ground, as indicated at 27, 28.

In the system of FIG. 1, during the positive-going output of the power amplifier, the loudspeaker diaphragm 13 is driven in the forward direction with less resistance and, during the negative-going portion of the signal, the diaphragm is driven rearwardly, with greater resistance. Accordingly, and in accordance with the invention, the signal to the loudspeaker 12 is modified to be relatively reduced during the positive-going portion of the cycle, in an amount reflecting the degree of asymmetry in the loudspeaker 12. To this end, during the positive-going portion of the cycle, the tube 22 is conductive, and the resistors 18, 25 function as a voltage divider, proportionally reducing the level of the positive-going signal delivered to the input of the power amplifier. During the negative-going phase of the cycle of input voltage, the tube 22 is nonconductive, and a full input signal is delivered to the power amplifier.

By way of a representational example, in FIG. 1a, there is illustrated a square wave input signal 29, as delivered from the signal input source 16 and which is symmetrical with respect to neutral 30. The modified signal, shown in FIG. 1b, remains unaffected at the negative-going side 31, but is relatively reduced at the positive-going side 32.

The extent of reduction or limiting of the positive-going signal in the circuit of FIG. 1 is a function of the resistors 18, 25 and is subject to fine tuning adjustment by means of the movable tap 19. The fine tuning adjustment may be either a factory adjustment during manufacture, or it may be operator controlled.

In the system illustrated in FIG. 2 of the drawings, the sound system employs a loudspeaker 40 having a conical diaphragm 41. In the case of a typical conical loudspeaker, there is greater radiation resistance in the forward direction (arrow 42) than in the rearward direction (arrow 43). The driving system must accordingly modify the output signal of power amplifier 44 in an opposite manner to the system of FIG. 1.

In the system of FIG. 2, a source 45 of modulated signal voltage is connected to the positive side 46 of the power amplifier through the adjustable tap 47 of a variable resistor 48. A vacuum tube 49 and resistor 50 are connected in series with the adjustable resistor 48 generally in the manner of the circuit of FIG. 1, except that the polarity of the vacuum tube 49 is reversed. The tube 49 is a three element device, with its grid 51 connected directly to the anode 52. The cathode 53 is connected to the adjustable tap 49, and the anode is connected to the resistor 50.

In the system of FIG. 2, during the positive-going cycle of the input signal, the tube 49 is nonconductive, and normal input is supplied to the power amplifier. During the negative-going cycle of the signal, the tube becomes conductive, and the negative voltage is reduced as a function of the resistors 48, 50, which form an adjustable voltage divider.

As shown in FIGS. 2a and 2b, the representative voltage signal 54 derived from the signal source 45 is symmetrical with reference to the neutral axis 55. The signal input to the power amplifier, however, is limited on the negative-going side, as at 56, as shown in FIG. 2b. The degree of limitation imposed on the negative-going signal is controlled by the adjustable tap 47 to, as close as practicable, compensate for the differences in radiation resistance in the forward and rearward movements of the loudspeaker diaphragm 41.

The system of FIG. 3 is similar to that of FIG. 2 except that the output of the power amplifier 60 is connected to a pair of loudspeakers 61, 62 by way of a passive cross-over circuit 63. In the illustrated system, the loudspeaker 61 is dedicated to higher frequencies and is connected through a high pass filter 64. The second loudspeaker 62 is dedicated to emit on lower frequencies, and is connected to the power amplifier through a low pass filter 65.

In the arrangement illustrated in FIG. 3, the high frequency loudspeaker 61 has a bowl-shaped diaphragm 66 which has greater radiation resistance in the forward direction (arrow 67) than in the rearward direction (arrow 68). The low frequency loudspeaker 62 has a conical diaphragm with greater radiation resistance in the forward direction (arrow 70) than in the rearward direction (arrow 71).

In the system of FIG. 3, it is necessary to select all of the commonly driven loudspeakers to have asymmetry in the same direction and, insofar as practicable, generally similar characteristics, such that the compensated signal delivered at the output of the power amplifier 60 is effective in both loudspeakers.

In the system of FIG. 3, since both loudspeakers are less resistant to radiation in the reverse direction, the negative-going signal is adjustably limited by the voltage divider constituted by adjustable resistor 72, vacuum tube 73 and resistor 74 connected in series. The three element tube has its grid 75 connected directly to its anode 76. The cathode 77 is connected to the adjustable tap 78 of resistor 72, such that the tube conducts during negative-going swings of signal voltage from the source 79.

Figure 4:
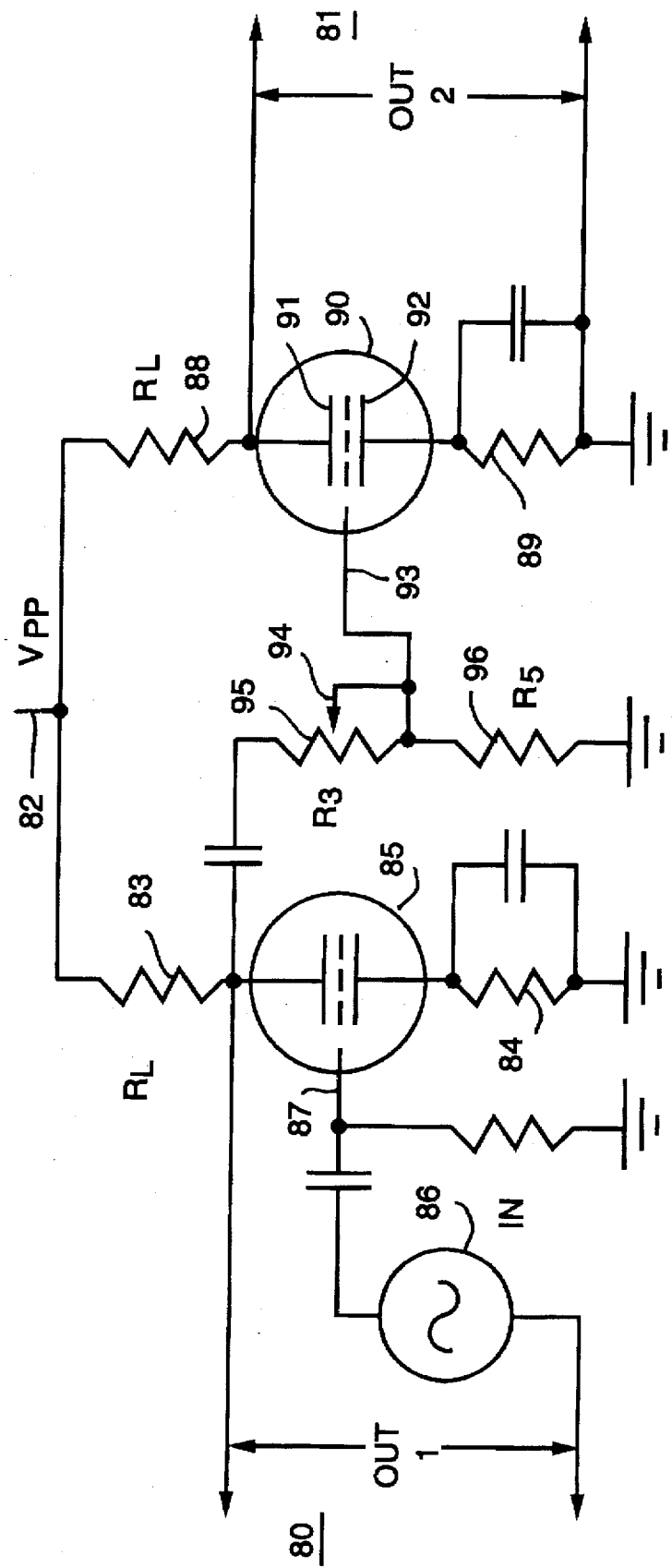
FIGS. 4 and 5 are simplified schematic illustrations of phase invertor circuit arrangements incorporated in the output of a push-pull power amplifier, with means incorporated in the phase invertor circuitry for modifying the output signal in accordance with the principles of the invention.

In the embodiment illustrated in FIG. 4, signal modification is incorporated into the power amplifier circuitry. In this respect, push-pull amplifiers typically include a phase invertor circuit ahead of the output stage, and in such cases signal modification means according to the invention can advantageously and economically be incorporated into the phase invertor circuitry, in a manner to act upon only one phase of the signal. Thus, in FIG. 3 there is illustrated a typical phase invertor circuit arrangement including first and second outputs 80, 81 which are controlled to be 180° out of phase with each other and, in accordance with the invention, one of the outputs is controlled to be of lesser amplitude than the other to compensate for asymmetrical characteristics of the loudspeaker (not shown) to which they are coupled.

In the schematic circuit of FIG. 4, a supply voltage 82 is connected to the first output 80 through a voltage divider comprised of resistors 83, 84 and the three element vacuum tube 85. A modulated input signal, from source 86 is applied to the grid 87 of the vacuum tube. In the illustrated arrangement, the vacuum tube has its cathode connected to the resistor 84 and its anode to the resistor 83. As the input signal from the source 86 varies, the output voltage at 80 varies as an inverse function thereof and provides a desired modulated at the output 80.

The second output 81 is connected to the supply voltage 82 through a voltage divider comprising resistors 88, 89 and a three element vacuum tube 90. The latter has its anode connected to the resistor 88, its cathode connected to the resistor 89 and its grid 93 connected to the adjustable tap 94 of a variable resistor 95 connected in series with a resistor 96. The resistors 95, 96 constitute a further voltage divider connected to the anode of the tube 85. The conductivity of the tube 90, which is an inverse function of the conductivity of the tube 85, can be varied in relation to the corresponding conductivity of the tube 85 by adjustment of the variable tap 94. The arrangement is such that the output of one polarity is controllably more or less than the output of the other polarity, to achieve the desired asymmetry of output to correspond with the inherent asymmetry of the loudspeaker(s).

Incorporating the signal modification circuitry into the amplifier can be beneficial in permitting solid state devices to be employed in place of vacuum tubes. Thus, in the circuit examples of FIGS. 1–3, silicon rectifiers cannot easily be substituted for the vacuum tube rectifiers because the solid state devices do not effectively rectify low level signals (e.g., below 0.6 volts). At the stage of the phase invertor, however, voltage levels are high enough to effectively employ solid state devices, and an illustrative circuit employing such is shown in FIG. 5.

Figure 5:
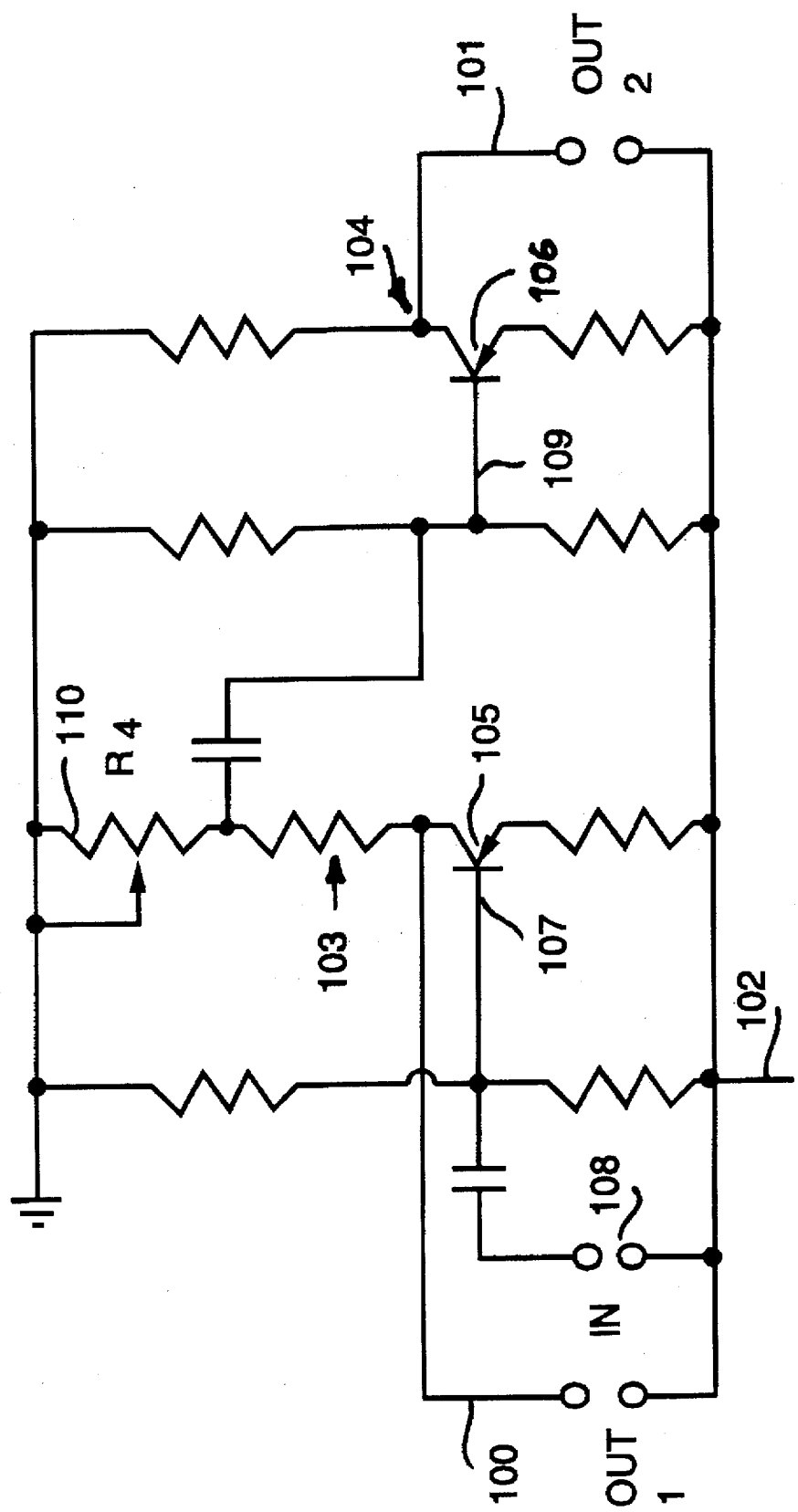

In the system of FIG. 5, first and second outputs 100, 101 are connected to a power voltage source 102 through voltage divider circuits 103,104 each including a transistor 105, 106. The base element 107 of the transistor 105 is driven by a modulated input signal from a signal source 108, while the base element 109 of the transistor 106 is driven from a secondary voltage divider including a variable resistor in 110 in series with the transistor 105. The signals delivered at the respective outputs 100, 101 can thus be varied, one with respect to the other, by adjustment of the resistor 110, to compensate for asymmetry in loudspeakers connected thereto.

In any of its many forms, the system of the invention is economical and effective, achieving improvements in sound output quality that are easily discernable to even a casual listener.

Because the system of the invention does not rely on feedback signals, but rather is an essentially static adjustment based upon the preascertained asymmetry of the loudspeaker(s), the additional circuitry required by the invention is minimal. Where the loudspeakers are incorporated with the system at the factory, the compensating circuit adjustments may be made during production. Where it is contemplated that component loudspeakers of various types may be connected to the system by the user, the relevant adjustable resistors can be made accessible to the user for adjustment when the characteristics of the loudspeakers are determined.

It should be understood, of course, that the specific forms of the invention herein illustrated and described are intended to be representative only, as certain changes may be made therein without departing from the clear teachings of the disclosure. Accordingly, reference should be made to the following appended claims in determining the full scope of the invention.

I claim:

1. An audio output system which comprises
   (a) a source of modulated electrical signals,
   (b) an electrically driven loudspeaker connected to said source and operative to provide an audible output corresponding generally to said modulated electrical signals,
   (c) said loudspeaker having asymmetrical output characteristics as a function of the geometry thereof, whereby equal electrical signals supplied to said loudspeaker with opposite polarities will result in a greater response in one direction than the other, and
   (d) a unidirectional voltage limiting circuit associated with said source of modulated electrical signals and operative to proportionally reduce the signal voltage of a signal of a first polarity for driving said loudspeaker in said one direction.

2. An audio output system according to claim 1, wherein
   (a) said unidirectional voltage limiting circuit comprises a voltage divider circuit connected associated with said source of modulated electrical signals,
   (b) said voltage divider circuit including a rectifier device permitting current flow in said divider circuit when the modulated signal is of said first polarity.

3. An audio output system according to claim 2, wherein
   (a) said voltage divider circuit includes an adjustable resistor.

4. An audio output system according to claim 2, wherein
   (a) said source of modulated signals includes a power amplifier having an input side and an output side,
   (b) said voltage limiting circuit is associated with the input side of said amplifier, and
   (c) said rectifier device is a vacuum tube connected as a diode.

5. An audio output system according to claim 2, wherein
   (a) said source of modulated signals includes a power amplifier having an input side and an output side,
   (b) said voltage limiting circuit is associated with the output side of said amplifier, and
   (c) said rectifier device is a solid state device.

6. An audio output system according to claim 1, wherein
   (a) said system includes at least first and second loudspeakers and associated crossover circuit means for driving one of said loudspeakers primarily with signals of a higher frequency and another of said loudspeakers primarily with signals of a lower frequency,
   (b) said unidirectional voltage limiting circuit being associated with an input side of said crossover circuit means, and
   (c) each of said loudspeakers being connected to said crossover circuit means in a manner that a signal voltage of a first polarity will drive all of the loudspeakers in a direction of greater response.

7. An audio output system according to claim 1, wherein
   (a) said system includes an amplifier having an output stage and including phase invertor circuit means located before said output stage,
   (b) said phase invertor having first and second outputs of opposite phase, and
   (c) said voltage limiting circuit comprising signal limiting means incorporated in one of said outputs.

8. An audio output system according to claim 7, wherein
   (a) said first and second outputs have respective first and second signal amplifying circuits,
   (b) an output of said first signal amplifying circuit forming a controlling input for the second amplifying circuit, and
   (c) said controlling input including adjustable means, whereby said second output can be controllably limited relative to said first output to compensate for asymmetry in said loudspeaker.

9. An audio output system according to claim 8, wherein
   (a) a control input for the first one of said amplifying circuits comprises a modulated signal to be amplified, and
   (b) a control input for the second one of said amplifying circuits comprises an output signal from a voltage divider circuit including said adjustable means.

* * * * *